(12) United States Patent
Huerner et al.

(10) Patent No.: US 11,031,463 B2
(45) Date of Patent: Jun. 8, 2021

(54) SILICON CARBIDE SEMICONDUCTOR DEVICE

(71) Applicant: Infineon Technologies AG, Neubiberg (DE)

(72) Inventors: Andreas Huerner, Nuremberg (DE); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/437,768

(22) Filed: Jun. 11, 2019

(65) Prior Publication Data

US 2019/0393299 A1 Dec. 26, 2019

(30) Foreign Application Priority Data

Jun. 22, 2018 (DE) .......................... 102018115110.1

(51) Int. Cl.
| | | |
|---|---|---|
| *H01L 29/06* | (2006.01) | |
| *H01L 29/10* | (2006.01) | |
| *H01L 29/16* | (2006.01) | |
| *H01L 29/78* | (2006.01) | |

(52) U.S. Cl.
CPC ........ *H01L 29/063* (2013.01); *H01L 29/0696* (2013.01); *H01L 29/1095* (2013.01); *H01L 29/1608* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 5,665,988 A | * | 9/1997 | Huang | H01L 29/1016 257/133 |
| 2005/0152080 A1 | * | 7/2005 | Harris | H01L 29/0696 361/56 |
| 2010/0006861 A1 | * | 1/2010 | Yamamoto | H01L 29/66068 257/77 |
| 2015/0054038 A1 | * | 2/2015 | Masliah | H01L 29/7832 257/262 |
| 2015/0097226 A1 | * | 4/2015 | Lichtenwalner | H01L 29/66333 257/329 |
| 2016/0155726 A1 | * | 6/2016 | Kanazawa | H01L 29/1608 257/77 |
| 2018/0337275 A1 | * | 11/2018 | Shimizu | H01L 29/0696 |

FOREIGN PATENT DOCUMENTS

| | | |
|---|---|---|
| DE | 102016110035 A1 | 11/2017 |
| DE | 102016113846 A1 | 2/2018 |
| DE | 102016125030 A1 | 6/2018 |

* cited by examiner

*Primary Examiner* — Khaja Ahmad

(74) *Attorney, Agent, or Firm* — Murphy, Bilak & Homiller, PLLC

(57) ABSTRACT

A SiC semiconductor device includes a first load electrode, a normally-on junction field effect transistor, and an insulated gate field effect transistor. The normally-on junction field effect transistor includes a channel region electrically connected to the first load electrode. The insulated gate field effect transistor and the normally-on junction field effect transistor are electrically connected in series. The insulated gate field effect transistor includes a source region and a body region. The source region is electrically connected to a channel region of the normally-on junction field effect transistor. The body is electrically connected to the first load electrode.

20 Claims, 8 Drawing Sheets

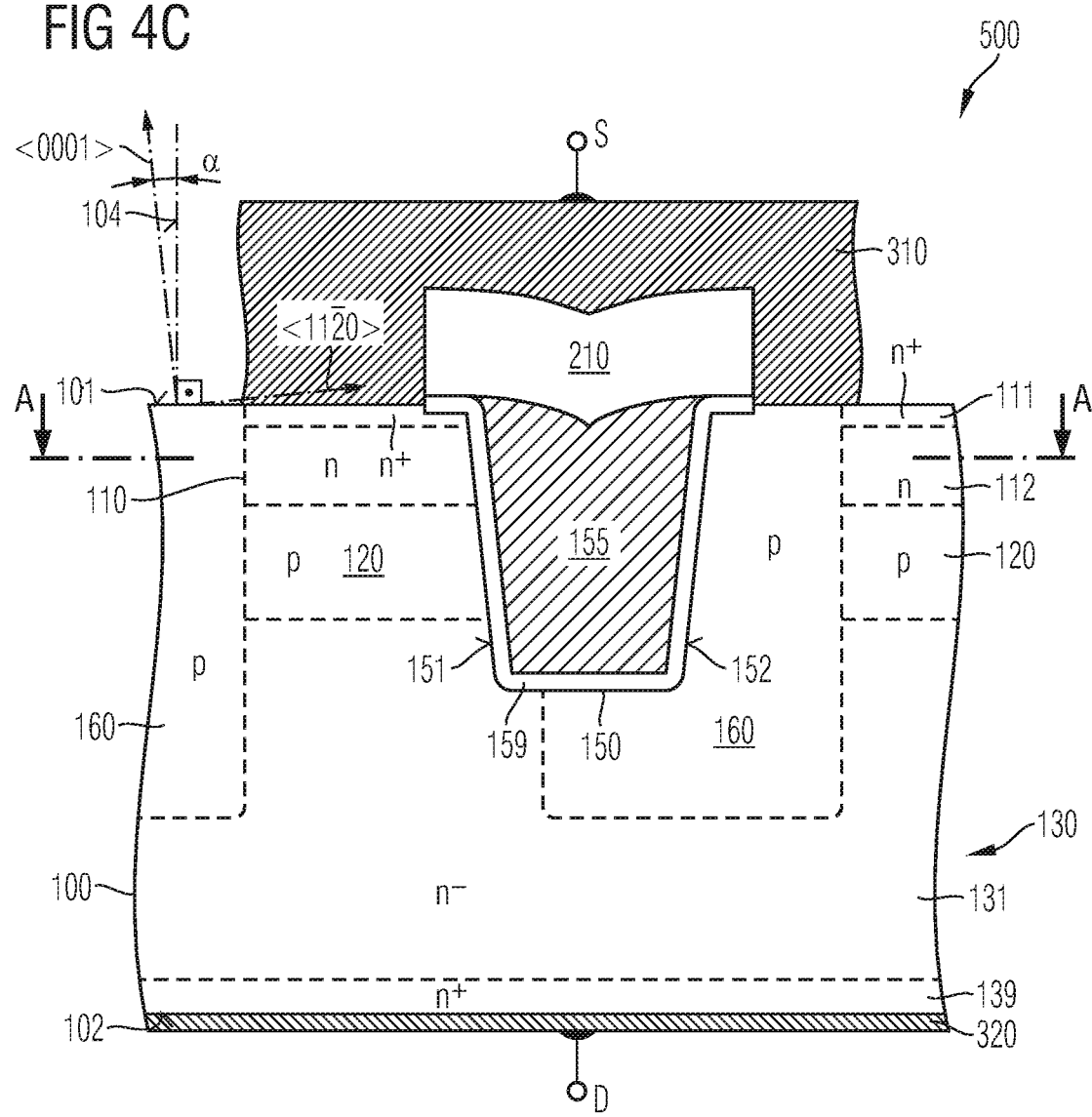

SILICON CARBIDE SEMICONDUCTOR DEVICE

TECHNICAL FIELD

The present disclosure relates to silicon carbide semiconductor devices with high voltage blocking capability.

BACKGROUND

The wide bandgap of silicon carbide (SiC) along with low intrinsic carrier concentration and high critical electrical field is suitable for fabricating power semiconductor devices with large blocking voltage and small on-resistance.

Power semiconductor devices are typically used for controlling the transfer of electric energy from an input stage to an output stage, for example in DC/AC converters, AC/AC converters or AC/DC converters. In typical converter topologies a short circuit condition at a load side transforms in a short-circuit condition for the power semiconductor device. A short-circuit detection circuit may detect the short-circuit condition and may switch-off the power semiconductor device and/or may activate a circuit breaker. For a time period between the start and end of the short-circuit condition a high short-circuit current flows through the power semiconductor device.

There is a need for improving the short-circuit ruggedness of silicon carbide devices.

SUMMARY

An embodiment of the present disclosure relates to a silicon carbide semiconductor device that includes a first load electrode, a normally-on junction field effect transistor and an insulated gate field effect transistor. The normally-on junction field effect transistor includes a channel region electrically connected to the first load electrode. The insulated gate field effect transistor and the junction field effect transistor are electrically connected in series. The insulated gate field effect transistor includes a source region and a body region. The source region is electrically connected to the channel region of the normally-on junction field effect transistor. The body region is electrically connected to the first load electrode.

Another embodiment of the present disclosure relates to a semiconductor device that includes a gate structure, a source region and an auxiliary control structure. The gate structure extends from a first surface of a silicon carbide body into the silicon carbide body. The source region extends from the first surface into the silicon carbide body. The auxiliary control structure extends from the first surface into the source region. A vertical extension of the auxiliary control structure is smaller than a vertical extension of the source region.

A further embodiment of the present disclosure relates to a semiconductor device that includes a first load electrode, a gate structure, and a source region. The gate structure extends from a first surface of a silicon carbide body into the silicon carbide body. The source region extends from the first surface into the silicon carbide body and includes a contact portion and a channel portion. The contact portion is in contact with the first load electrode. The channel portion is in contact with the gate structure. The contact portion and the channel portion form a unipolar junction.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate the embodiments of a SiC device and a semiconductor device and together with the description serve to explain principles of the embodiments. Further embodiments are described in the following detailed description and the claims.

FIGS. 4A-4C show schematic horizontal and vertical cross-sectional views of a portion of a SiC device according to another embodiment including a plurality of auxiliary portions extending from a first surface into the source region.

DETAILED DESCRIPTION

Figure 1A:
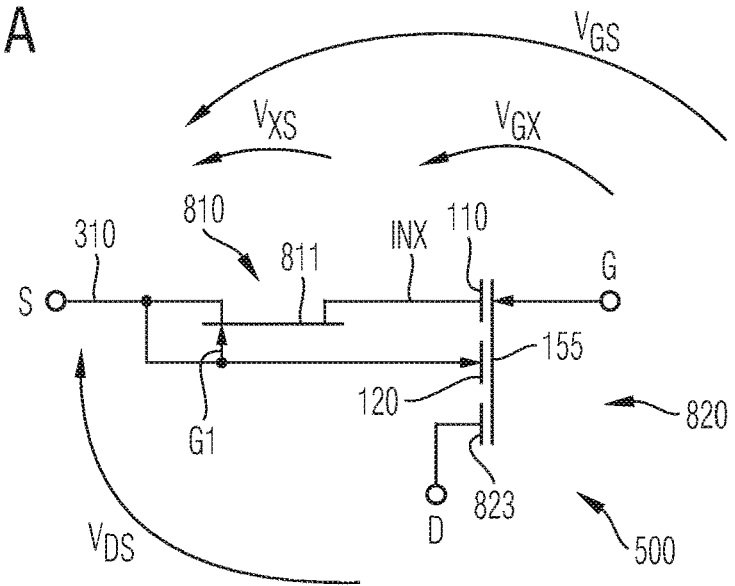
FIG. 1A shows a circuit diagram of a SiC device that includes a JFET and an IGFET electrically connected in series according to an embodiment.

In the following detailed description, reference is made to the accompanying drawings, which form a part thereof and in which are shown by way of illustrations specific embodiments in which a SiC device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doped regions of the same conductivity type and with different dopant concentrations form a unipolar junction, e.g., an n/n+ or p/p+ junction along a boundary surface between the two doped regions. At the unipolar junction a dopant concentration profile orthogonal to the unipolar junction may show a step or a turning point, at which the dopant concentration profile changes from being concave to convex, or vice versa.

Ranges given for a parameter include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage-controlled devices including MOSFETs (metal oxide semiconductor FETs) and other FETs with gate electrodes based on doped semiconductor material and/or with gate dielectrics that are not exclusively based on an oxide.

According to at least one embodiment, a SiC device may include a first load electrode, a normally-on JFET (junction field effect transistor), and/or an IGFET. The IGFET and the JFET may be electrically connected in series. The JFET may include a channel region that is electrically connected to the first load electrode. The IGFET may include a source region that is electrically connected, e.g., in direct contact, with the channel region. The IGFET further includes a body region that may be electrically connected to the first load electrode.

For load conditions within an SOA (safe operating area), a change of the electrical resistance of the channel region is negligible. The SOA defines voltage and current conditions over which the SiC device can be expected to operate without self-damage. The SOA is given by maximum values for device parameters like maximum continuous load current, maximum gate voltage and others.

With increasing load current through the JFET channel region, the voltage drop along the JFET channel region $V_{xs}$ increases. Since $V_{GS}$ is kept constant, the IGFET gate-to-source-voltage $V_{GX}$ may decrease.

Under short-circuit conditions the voltage drop along the JFET channel region reduces the saturation current through the IGFET. By suitably defining geometric dimensions and/or a dopant concentration of the JFET, the saturation current of the SiC device may be adjusted such that the maximum thermal stress is sufficiently low to avoid irreversible damage, e.g. a melting of a metal contact. The SiC device may show high short-circuit ruggedness.

The increasing voltage drop along the JFET channel region may result from the temperature rise in the JFET channel region owing to an increase in load current. With increasing temperature charge carrier mobility may decrease and the electric resistance of the JFET channel region may increase.

According to an embodiment, the junction field effect transistor may include a gate region. The gate region of the junction field effect transistor and the JFET channel region may form a pn junction. The gate region may be electrically connected to the first load electrode. Along the pn junction, a potential difference between the gate region and the channel region may rise with increasing distance to the first load electrode at a rate that rises with increasing load current. A depletion zone extending from the pn junction into the channel region gradually narrows down the effective area through which charge carriers flow through the channel region and at least contributes to that the electrical resistance of the channel region rises with rising load current.

According to an embodiment, the first load electrode may be electrically connected to a source terminal through a low-impedance path and without an ohmic shunt. By this, static losses of the SiC device may be kept low.

According to an embodiment, the junction field effect transistor is configured to be controlled by a voltage drop across the channel region. The voltage drop is caused by a current flow between the first load electrode and the insulated gate field effect transistor.

According to an embodiment, the IGFET may include a trench gate structure. The JFET channel region may be in direct contact with the gate structure such that a portion of the JFET channel region forms at least a portion of the IGFET source region. The JFET may have no or only low impact on the device area efficiency. The device area efficiency may be defined as the ratio between total channel width of the IGFET and total surface area of the SiC device.

According to an embodiment, the SiC device may include a plurality of transistor cells. Each transistor cell may include an IGFET cell and a JFET cell embedded in the IGFET cell. For example, the JFET cell may be embedded in a source region of the IGFET cell such that the JFET cell may have no or only low impact on an area efficiency of the SiC device.

According to at least another embodiment, a SiC device may include a gate structure that extends from a first surface of a silicon carbide body into the silicon carbide body. The gate structure may thus be a trench gate structure. A source region may extend from the first surface into the silicon carbide body. An auxiliary control structure may extend from the first surface into the source region, wherein a vertical extension of the auxiliary control structure is smaller than a vertical extension of the source region. The source region may be in direct contact with the gate structure.

The vertical extension of a region or structure is the maximum extension of the region or structure orthogonal to the first surface. In other words, the vertical extension of the region or structure is equal to the distance between the first surface and that point of the concerned region or structure which is most remote from the first surface.

The auxiliary control structure may narrow the vertical extension of at least a portion of the source region such that in case a high current flows through the source region, the electrical resistance of the source region between a first end of the source region at the first surface and a second end of the source region at the gate structure may rise at a higher rate than without auxiliary control structure. The rise of the electrical resistance may be due to a temperature increase in the channel region and/or due to depletion zones that may spread into the source region. A saturation current of the semiconductor device can be adjusted to a significantly lower value than for a comparative example without the auxiliary control structure. The lower saturation current can be achieved without increasing a horizontal area of the source region.

According to an embodiment, the semiconductor device may include a first load electrode. The source region may include a contact portion and a channel portion, wherein the contact portion may be in contact with the first load electrode. The channel portion may be in contact with the contact portion and with the gate structure. A mean dopant concentration in the channel portion may be at most 10% of a maximum dopant concentration in the contact portion.

A comparatively high dopant concentration of the contact portion may form a low-resistive ohmic contact with the first load electrode. The dopant concentration in the channel portion may be selected independently from the dopant concentration in the contact portion such that a depletion zone extending into the channel portion may pinch off the channel portion at the saturation current to a sufficient degree.

The auxiliary control structure may include an auxiliary region, wherein the auxiliary region and the source region may form a pn junction. The auxiliary region may contribute to constricting and/or pinching off the channel portion. By gradually constricting the channel portion from two sides, the depletion zone constricts the channel portion at a higher rate and a higher dopant concentration may be selected for the channel portion for achieving the same saturation current. The higher dopant concentration may reduce the static on-state losses.

According to an embodiment, the auxiliary region may include a plurality of auxiliary portions and/or the channel portion may include a plurality of channel segments. The auxiliary portions and the channel segments may alternate along a horizontal first direction parallel to the first surface. The channel segments may be distributed, in particular evenly distributed, along the horizontal first direction. In one example, a distance between neighboring channel segments may be the same for each of the channel segments. The auxiliary portions may form counterdoped columns extending into the source region. Splitting the auxiliary region into a plurality of separated auxiliary portions may decrease, for a given saturation current, the electrical resistance of the source region in an operating range with a load current significantly lower than the saturation current.

According to an embodiment, the gate structure may have a longitudinal horizontal extension along a horizontal second direction, wherein the horizontal second direction is orthogonal to the horizontal first direction. The longitudinal horizontal extension is the greater one of two orthogonal horizontal extensions of the gate structure. Each of the channel segments may have a different distance to the gate structure than the other channel segments.

According to another embodiment, the gate structure may have a longitudinal horizontal extension along a horizontal second direction, wherein the horizontal second direction is parallel to the horizontal first direction. The channel segments and channel portions may run orthogonal to the gate structure.

In general, a center-to-center distance between neighboring channel segments may be selected independently from a center-to-center distance between neighboring gate structures.

According to an embodiment, the source region may include a third portion between the auxiliary control structure and the gate structure. The third portion may relax a depletion of a source region portion that is in direct contact with the gate structure and that may affect a charge carrier flow between the channel portion and an inversion channel formed along the gate structure.

According to at least one further embodiment, a semiconductor device may include a first load electrode, a gate structure that extends from a first surface of a silicon carbide body into the silicon carbide body and a source region that extends from the first surface into the silicon carbide body. The source region may include a contact portion and a channel portion. The contact portion may be in contact with the first load electrode. The channel portion may be in contact with the gate structure. The contact portion and the channel portion may form a unipolar junction.

A comparatively high dopant concentration in the contact portion may facilitate a low-resistive ohmic contact between the source region and the first load electrode. The dopant concentration in the channel portion may be selected independently from the dopant concentration in the contact portion such that a depletion zone extending into the channel portion may modulate an electrical resistance of the source region across a comparatively wide range.

According to an embodiment, an auxiliary control structure may extend from the first surface into the source region. The auxiliary control structure may narrow at least a portion of the source region such that a depletion zone extending into the source region can more effectively modulate the electrical resistance of the source region.

According to an embodiment, a mean dopant concentration in the channel portion may be at most 10% of a maximum dopant concentration in the contact portion. The dopant concentration in the contact portion may be sufficiently high to provide a low-resistive ohmic contact between the first load electrode and the source region. The dopant concentration in the channel region may be sufficiently low such that depletion zones extending into the source region can effectively reduce a saturation current of the semiconductor device.

According to an embodiment, a vertical extension of the auxiliary control structure is smaller than a vertical extension of the source region, for example such that the source region may include a continuous portion below the auxiliary control structure. The continuous portion may reduce the electrical resistance of the source region in the SOA.

According to an embodiment the auxiliary control structure may include an auxiliary region. The auxiliary region and the source region may form a pn junction. A depletion zone may extend from the auxiliary region into the source region such that the saturation current may be further reduced without increasing the on-state resistance during the normal operation mode.

FIG. 1A shows a three terminal SiC device 500 with a source terminal S, a drain terminal D and a gate terminal G. The SiC device 500 includes a normally-on JFET 810 electrically connected in series with an IGFET 820. A source side of a channel region 811 of the JFET 810 may be electrically connected to a first load electrode 310 that may form or that may be electrically connected to the source terminal S. A drain side of the JFET channel region 811 is electrically connected to a source region 110 of the IGFET 820. The drain side of the JFET channel region 811 and the IGFET source region 110 form an internal node INX. A drain region 823 of the IGFET 820 may be electrically connected to the drain terminal D. A JFET gate region G1 and a body region 120 of the IGFET 820 may be electrically connected to the source terminal S. A gate electrode 155 of the IGFET 820 is electrically connected to the gate terminal G.

The JFET channel region 811 has a channel length along a current flow direction between a first channel end and a second channel end. The first channel end may form an ohmic contact, e.g., a low-resistive contact with the first load electrode 310. The second channel end may directly adjoin the source region 110 of the IGFET 820.

The JFET channel region 811 and the IGFET source region 110 may be in direct contact with each other. For example, the JFET channel region 811 and the source region 110 may be portions of a homogeneous, doped region that results from an epitaxy process and/or from one or more implants effective in the same portion of a silicon carbide body. According to another embodiment, the JFET channel region 811 and the source region 110 may form a unipolar junction, for example an n/n+ junction or a p/p+ junction, wherein a difference between the dopant concentrations on both sides of the unipolar junction may be less than one order of magnitude. The dopant concentration in the JFET channel region 811 may be sufficiently low such that the depletion zone does not spread significantly into the counterdoped region, e.g., the IGFET body region. The IGFET source region 110 and the JFET channel region 811 may overlap to some degree in the way that the same region may be effective as part of the JFET channel region 811 and as part of the IGFET source region 110.

The JFET may further include a JFET gate region G1, wherein the JFET gate region G1 and the JFET channel region 811 form a pn junction. The JFET gate region G1 may be electrically connected to the first load electrode 310 through a low-impedance path. The IGFET body region 120 and the JFET gate region G1 may overlap to some degree in the way that the same region may be effective as part of the JFET gate region G1 and as part of the IGFET body region 120.

In the following, a mode of operation of the SiC device 500 is described with respect to an embodiment concerning an re-channel SiC device 500 with n-type JFET channel region 811, n-type IGFET source region 110, p-type JFET gate region G1 and p-type IGFET body region 120. Other embodiments may relate to a p-channel SiC device 500 with p-type JFET channel region 811, p-type IGFET source region 110, n-type IGFET body region 120 and n-type JFET gate region G1.

In the forward operation mode a positive drain-to-source voltage VDS is applied between the drain terminal D and the source terminal S. A gate-to-source voltage VGS exceeding a predefined threshold turns the IGFET 820 on, wherein an n-type inversion channel forms by field effect in the body region 120. In the on-state, electrons flow from the source terminal S through the JFET channel region 811 and through the inversion channel to the drain terminal D.

In the on-state, the effective IGFET gate voltage is given by a voltage drop across the gate dielectric at the drain-sided end of the inversion channel, i.e., a voltage difference between the potential applied to the gate terminal and the potential of the inversion channel at the drain-sided end. The potential of the inversion channel at the drain-sided end is given by the potential at the internal node INX and the voltage drop along the inversion channel.

In other words, the effective IGFET gate voltage directly depends on the effective IGFET gate-to-source voltage VGX being the potential difference between the gate terminal G and the internal node INX. For a load current within the SOA, an electrical resistance of the JFET 810 and a channel voltage VXS along the JFET channel region 811 are negligible and the effective IGFET gate-to-source voltage VGX remains unaffected by the load current. With increasing load current, the temperature in the JFET channel region rises and charge carrier mobility decreases. The electric resistance of the JFET channel region 811 increases and the JFET channel voltage VXS rises. A rise of the JFET channel voltage VXS reduces the effective IGFET gate-to-source voltage VGX such that the saturation current of the IGFET 820 decreases.

The increasing channel voltage VXS further increases at a rate, at which a voltage drop across the pn junction between the JFET gate region G1 and the JFET channel region 811 increases with increasing distance to the first load electrode 310. A depletion zone spreading from the pn junction into the JFET channel region 811 more and more constricts the JFET channel region 811 for electrons and at least contributes to the increase of the channel resistance and the channel voltage VXS.

Parameters of the JFET 810 like geometric dimensions and dopant concentration may be selected to achieve a saturation current for the SiC device 500 sufficiently low to prevent the SiC device 500 from being irreversibly damaged. In addition or alternatively, parameters of the JFET 810 may be selected such that the JFET channel region 811 is completely pinched off when the load current exceeds a predefined threshold and/or when the saturation current flows longer than a predefined period of time. The JFET 810 allows for combining low static on-state losses for high load currents with a low saturation current and/or with high short-circuit ruggedness.

The SiC device 500 may include a plurality of transistor cells, wherein each transistor cell may include an IGFET cell and a JFET cell embedded in the IGFET cell such that each IGFET cell may be assigned to one JFET cell and each JFET cell may be assigned to one IGFET cell. By vertical integration of the JFET cell into the source region of the IGFET cell, the JFET cell has no impact on the area efficiency of the SiC device 500.

Figure 1B:
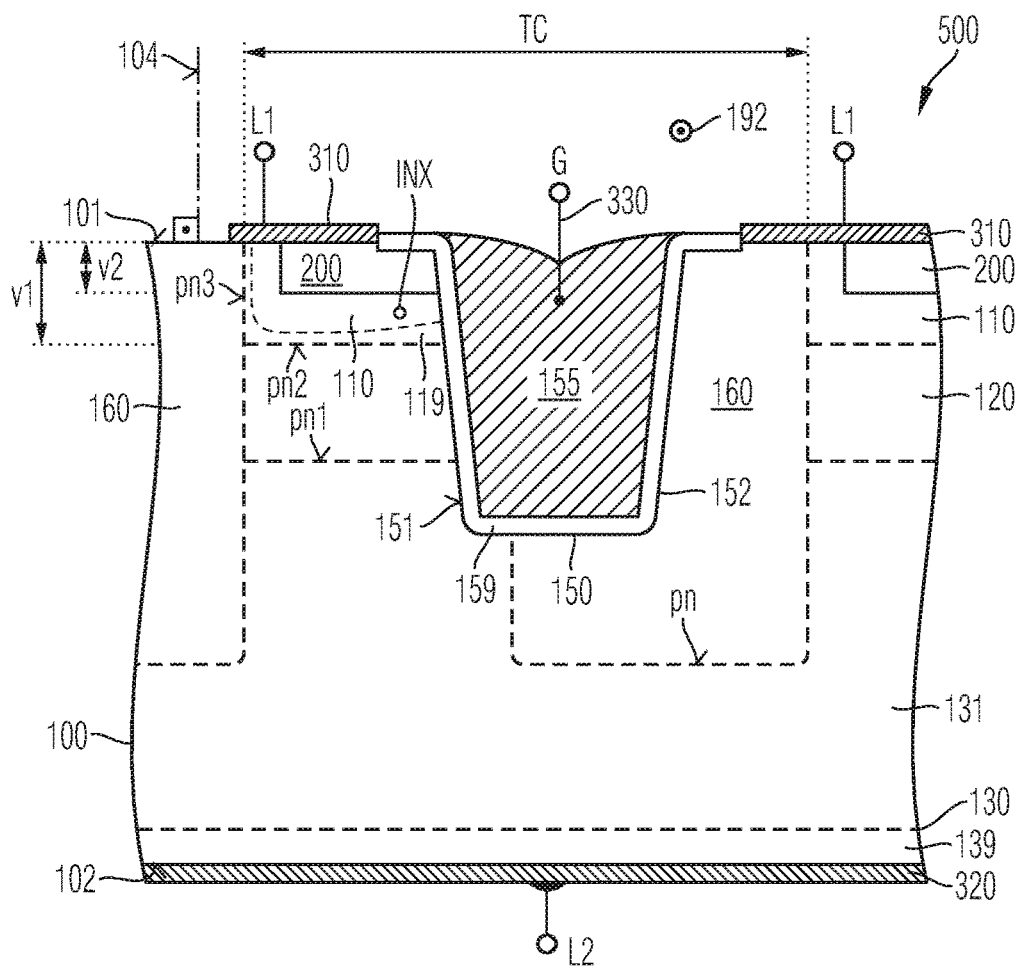
FIG. 1B shows a schematic vertical cross-sectional view of a portion of a SiC device including an IGFET and a JFET integrated in the source region of the IGFET according to an embodiment.

FIG. 1B shows a SiC device 500 that provides an IGFET functionality between a gate terminal G, a first load terminal L1 and a second load terminal L2. With respect to the terminals G, L1, L2, the SiC device 500 shows the functionality of an IGFET and the SiC device 500 may replace a conventional MOSFET with the same nominal voltage blocking capability. The SiC device 500 may include a plurality of transistor cells TC, wherein each transistor cell TC may include a JFET cell integrated in a source region 110 of an IGFET cell. The SiC device 500 may be a vertical power semiconductor device in which a load current flows between a first load electrode at a front side and a second load electrode on the back.

The SiC device 500 includes a silicon carbide body 100 which may be based on a silicon carbide crystal including the main constituents silicon and carbon. The silicon carbide crystal may include unwanted impurities like hydrogen and oxygen and/or intended impurities, e.g., dopant atoms. The polytype of the silicon carbide crystal may be 2H, 6H, 15R or 4H, by way of example.

A first surface 101 at a front side of the silicon carbide body 100 may be planar or ripped. A surface normal 104 orthogonal to a planar first surface 101 or orthogonal to a mean plane of a ripped first surface 101 defines a vertical direction. Directions orthogonal to the surface normal 104 are horizontal and lateral directions.

On the backside of the silicon carbide body 100 an opposite second surface 102 may extend parallel to the first surface 101. A total thickness of the silicon carbide body 100 between the first and second surfaces 101, 102 may be in the range of several hundred nm to several hundred μm. The nominal voltage blocking capability of the SiC device 500 may be at least 330V, e.g., at least 600V.

The transistor cells TC are formed at the front side along the first surface 101. A transistor cell TC may include a trench gate structure 150 that extends from the first surface 101 into the silicon carbide body 100. A vertical extension of the gate structure 150 may be in a range from 0.3 μm to 5 μm, e.g., in a range from 0.5 μm to 2 μm. At the bottom, the gate structures 150 may be rounded, wherein a radius of the curvature may be at least twice the thickness of a gate dielectric 159 described in the following. Sidewalls 151, 152 of the gate structures 150 may be vertical or may tapper with increasing distance to the first surface 101.

The gate structure 150 may be arranged in a stripe structure with a longitudinal extension along a horizontal second direction 192 orthogonal to the cross-sectional plane. The longitudinal extension is greater than a horizontal width of the gate structure 150. The horizontal width of the gate structure 150 in the plane of the first surface 101 may be in a range from 500 nm to 5 μm, e.g., in a range from 1 μm to 3 μm.

Each gate structure 150 may extend from one side of a transistor cell region to an opposite side, wherein the length of the gate structures 150 may be up to several millimeters. According to other embodiments a plurality of separated gate structures 150 may be formed along a line extending from one side of the transistor cell region to the opposite side, or the gate structures 150 may be connected to each other and may form a grid. According to another embodiment, two orthogonal horizontal dimensions of the gate structure 150 may be within the same order of magnitude.

The gate structures 150 of the SiC device 500 may be equally spaced, may have the same width, and/or may form a regular pattern. A center-to-center distance between neighboring gate structures 150 (also called "pitch") may be in a range from 1 μm to 10 μm, e.g., from 2 μm to 5 μm.

Each gate structure 150 includes a gate dielectric 159 and a conductive gate electrode 155, wherein the gate electrode 155 is electrically separated from the silicon carbide body 100. For example, the gate dielectric 159 may completely separate the gate electrode 155 from the silicon carbide body 100. According to other embodiments, one or more further dielectric structures with a material configuration different from the gate dielectric 159 and/or thicker than the gate dielectric 159 may be formed between the gate electrode 155 and the silicon carbide body 100.

The gate dielectric 159 separates the gate electrode 155 at least from a body region 120 and may include or consist of a semiconductor dielectric, for example, thermally grown or deposited semiconductor oxide, e.g., silicon oxide, a semiconductor nitride, e.g., deposited or thermally grown silicon nitride, and/or a semiconductor oxynitride, e.g., silicon oxynitride. Thickness and material configuration of the gate dielectric 159 may be selected to achieve a threshold voltage in a range from 1.0 V to 8 V for the transistor cell TC. The gate electrode 155 includes one or more conductive material(s), e.g., heavily doped polycrystalline silicon.

A drift structure 130 separates the transistor cells TC from the second surface 102 on the backside of the silicon carbide body 100. The drift structure 130 may include a heavily doped contact structure 139 along the second surface 102 and a lightly doped drift zone 131 between the transistor cells TC and the heavily doped contact structure 139.

The heavily doped contact structure 139 may be or may include a substrate portion obtained from a crystalline ingot and forms an ohmic contact with a second load electrode 320 that directly adjoins the second surface 102. A mean dopant concentration in the contact structure 139 is sufficiently high to ensure a low-resistive ohmic contact with the second load electrode 320. The contact structure 139 may have the same conductivity type as the drift zone 131.

The drift zone 131 may be formed in a layer grown by epitaxy on the contact structure 139. A mean net dopant concentration in the drift zone 131 may be in the range from $1E15$ cm$^{-3}$ to $5E16$ cm$^{-3}$. A vertical extension of the drift zone is related to a nominal blocking capability of the SiC device 500. The drift structure 130 may include further doped regions, which may have the conductivity type of the drift zone 131, for example, field stop zones, barrier zones and/or current spread zones, or which may have the opposite conductivity type of the drift zone 131.

The drift zone 131 may directly adjoin the contact structure 139 or a buffer layer that forms a unipolar homojunction with the drift zone 131, may be formed between the drift zone 131 and the contact structure 139.

Each transistor cell TC further includes a source region 110 and a body region 120. The source region 110 may directly adjoin the first surface 101. The body region 120 separates the source region 110 from the drift structure 130. The source region 110 and the body region 120 may be in direct contact with a first sidewall 151 of the gate structure 150.

The body region 120 forms a first pn junctions pn1 with the drift structure 130 and a second pn junction pn2 with the source region 110. A vertical extension of the body region 120 corresponds to a channel length of the transistor cell TC and may be in a range from 0.2 μm to 1.5 μm. The source region 110 and the body region 120 are electrically connected to a first load electrode 310 at the front side.

The first load electrode 310 may form or may be electrically connected or coupled to the first load terminal L1, which may be an anode terminal of an MCD or a source terminal of an IGFET. The second load electrode 320 may form or may be electrically connected or coupled to a second load terminal L2, which may be a cathode terminal of an MCD or a drain terminal of an IGFET.

A shielding region 160 of the conductivity type of the body region 120 may separate a portion of the gate structure 150 from the drift structure 130. The shielding region 160 may be in direct contact with a second sidewall 152 of the gate structure 150. The shielding region 160 may be electrically connected with the first load electrode 310. A maximum dopant concentration in the shielding region 160 may be higher, e.g., at least ten times higher than a dopant concentration in the body region 120. A local dopant concentration maximum of the shielding region 160 may be between the gate structure 150 and the second surface 102. The shielding region 160 may form a third pn junction pn3 with the source region 110.

According to an embodiment, the transistor cell TC is an n-channel IGFET cell with p-doped body region 120, n-doped source region 110 and n-doped drift zone 131. According to another embodiment, the transistor cell TC is a p-channel IGFET cell with n-doped body region 120, p-doped source region 110 and p-doped drift zone 131.

The gate dielectric 159 capacitively couples a channel section of a p-type body region 120 of an n-channel SiC device 500 to the gate electrode 155. When a potential at the gate electrode 155 exceeds a threshold voltage of the SiC device 500, the electric field of the gate electrode 155 effects that in the body region 120 minority charge carriers (electrons) form an inversion channel along the gate dielectric

159. The inversion channel connects the source region 110 with the drift structure 130 and provides a conductive path for electrons such that in the on-state of the SiC device 500, a load current flows in a vertical direction through the silicon carbide body 100 from the first load electrode 310 to the second load electrode 320.

An auxiliary structure 200 extends from the first surface 101 into the source region 110. A vertical extension v2 of the auxiliary structure 200 may be smaller than a vertical extension v1 of the source region 110. The auxiliary structure 200 may include dielectric material, conductive material and/or doped semiconductor material.

In the source region 110 the load current flows between a first end of the source region 110 and a second end of the source region 110, wherein the first end is in direct contact with the first load electrode 310 and the second end may be in direct contact with the gate structure 150. The second end of the source region 110 marks an internal network node INX resulting from the finite conductivity of the source region 110.

Since the first load electrode 310 is electrically connected to both the body region 120 and the source region 110, no voltage other than a diffusion voltage drops across the third and second pn junctions pn2, pn3 as long as no load current flows. With increasing load current a voltage drop between the second end and the first end of the source region increases. Since no current flows in the body region 120, the potential in the body region 120 is tied to the potential of the first load electrode 310 and a voltage drop along the third and second pn junctions pn3, pn2 increases with increasing distance to the first load electrode 310 and with increasing load current.

A depletion zone 119 extending from the third and second pn junctions pn3, pn2 into the source region 110 expands with increasing load current and gradually constricts the area through which the charge carriers flow in the source region 110. The expanding depletion zone 119 increases the electrical resistance of the source region 110 between the first end and the second end. A positive temperature coefficient of the electrical resistance of the source region 110 may contribute to the increase of the electrical resistance to a significant degree.

The auxiliary structure 200 reduces the effective cross-sectional area for a lateral current flow parallel to the second pn junction pn2 and for a vertical current flow parallel to the third pn junction pn3 such that a sufficient rise of the electrical resistance can be achieved for a significant reduction of the saturation current.

Portions of the body region 120 and the shielding region 160 forming the second and third pn junctions pn2, pn3 may be effective as JFET gate region G1 in the sense of FIG. 1A. The source region 110 may be effective as JFET channel region 811 in the sense of FIG. 1A. The drift structure 130 may be effective as IGFET drain region 823 in FIG. 1A.

The auxiliary structure 200 may be a doped region of the conductivity type of the body region 120 such that depletion zones 119 extend from opposite sides into the source region 110. According to another embodiment the auxiliary structure 200 may be a low-doped region of the conductivity type of the source region 110.

Figure 2:
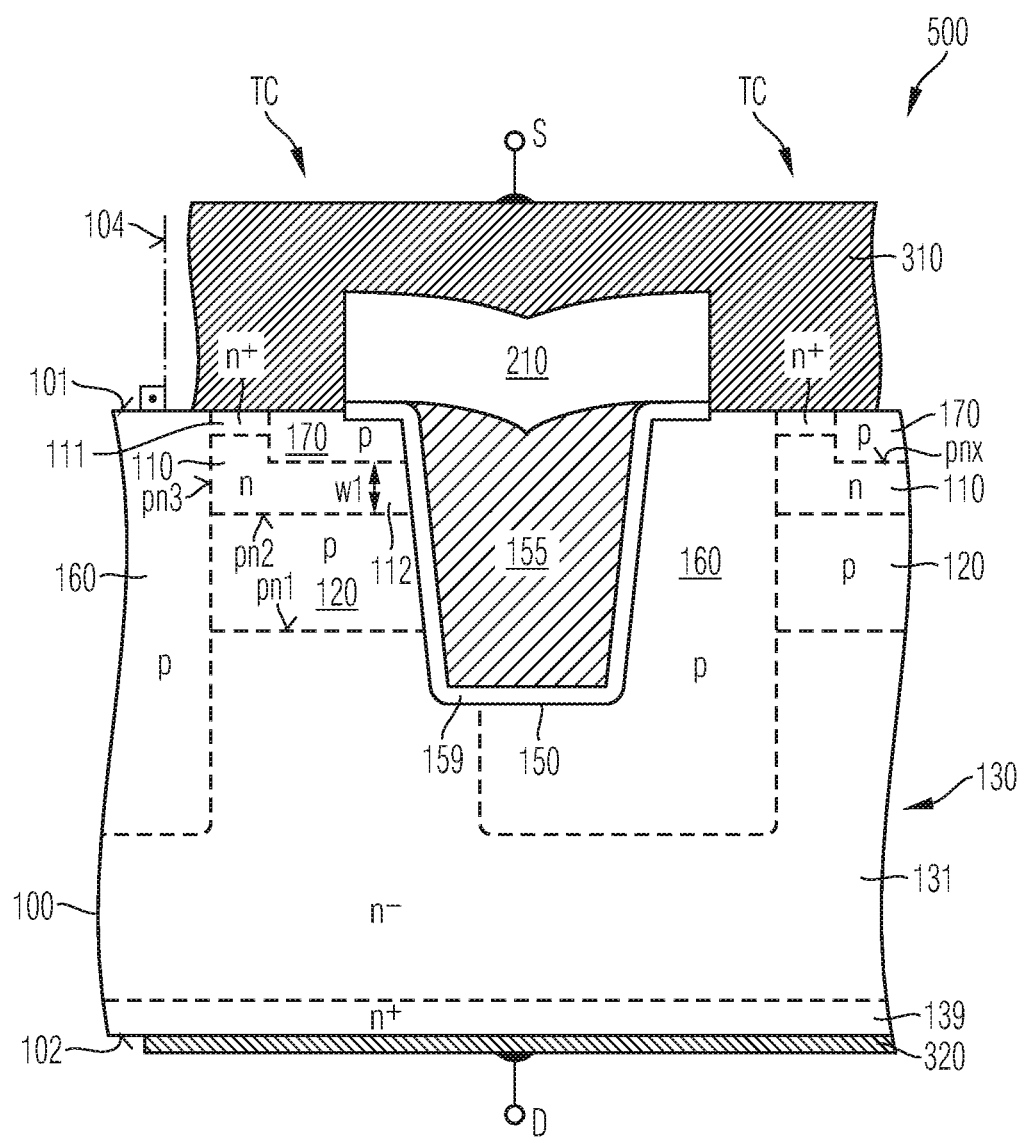
FIG. 2 shows a schematic vertical cross-sectional view of a SiC device according to an embodiment with an auxiliary region extending from a first surface into a source region of an IGFET cell.

In FIG. 2 the SiC device 500 is a SiC-TMOSFET (SiC Trench MOSFET) with n-channel transistor cells TC. The first load electrode 310 forms a source terminal S or is electrically connected or coupled to a source terminal S. The second load electrode 320 forms a drain terminal D or is electrically connected or coupled to a drain terminal D. An interlayer dielectric 210 separates the first load electrode 310 and the gate electrode 155 from each other.

The source region 110 may include a heavily doped contact portion 111 that is in direct contact with the first load electrode 310. The source region 110 further includes a channel portion 112, wherein a maximum dopant concentration in the channel portion 112 is at most 10% of a maximum dopant concentration in the contact portion 111 and wherein a first end of the channel portion 112 forms a unipolar junction with the contact portion 111. A second end of the channel portion 112 may be in contact with the gate structure 150.

The auxiliary structure 200 includes an auxiliary region 170 forming an auxiliary pn junction pnx with the source region 110. The auxiliary region 170 may be formed by ion implantation. The auxiliary region 170 may float. According to the illustrated embodiment, the auxiliary region 170 may be electrically connected to the first load electrode 310 such that depletion zones 119 spread from opposite sides into the source region 110.

By providing depletion zones 119 on opposite sides a control ratio descriptive for a ratio between a change of the electrical resistance of the source region and a change of the load current can be increased and/or a dopant concentration in the channel portion 112 may be increased such that the electrical resistance of the source region 110 for load conditions within the SOA can be reduced. The channel portion 112, the body region 120 and the auxiliary region 170 form a lateral JFET within the source region 110 of the transistor cell TC.

According to an embodiment, the SiC device 500 may include a first load electrode 310 and a silicon carbide body 100, wherein a gate structure 150 extends from a first surface 101 of the silicon carbide body 100 into the silicon carbide body 100. A semiconducting region 120, 160, 170 formed in the silicon carbide body 100 is electrically connected to the first load electrode 310. The semiconducting region 120, 160, 170 and a source region 110 form a pn junction pn2, pn3, pnx, wherein the source region 110 extends from the first load electrode 310 to the gate structure 150. The source region 110 includes a channel portion 112 with a first dopant concentration N1 and a minimum width w1 perpendicular to the pn junction pn2, pn3, pnx, wherein the first dopant concentration is less than $1E17\ cm^{-3}$.

In the semiconductor device an electrical resistance of the channel portion 112 changes by factor 2 at an increase of the load current through the source region 110 by factor 4.

Figure 3:
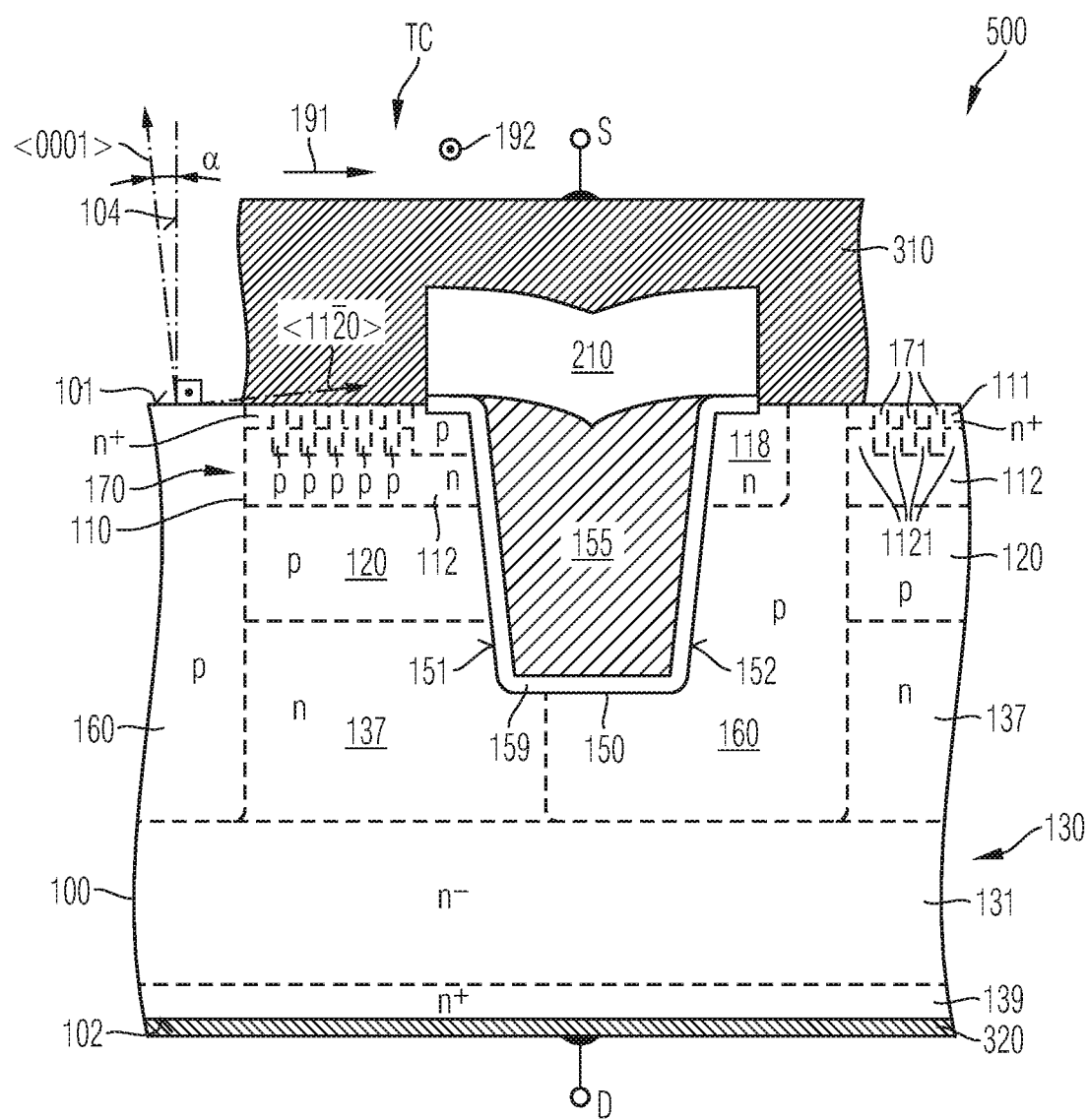
FIG. 3 shows a schematic vertical cross-sectional view of a portion of a SiC device according to an embodiment including a plurality of auxiliary portions extending from a first surface into a source region.

FIG. 3 refers to a SiC device 500 with a silicon carbide body 100 based on 4H-SiC. The <0001> crystal axis is tilted by an off-axis angle α to the surface normal 104. The <11-20> crystal axis is tilted by the off-axis angle α with respect to the horizontal plane. The <1-100> crystal axis is orthogonal to the cross-sectional plane. The off-axis angle α may be in a range from 2° to 8°. For example, the off-axis angle α may be about 4°.

The gate structures 150 may taper with increasing distance to the first surface 101. For example, a taper angle of the gate structures 150 with respect to the vertical direction may be equal to the off-axis angle α or may deviate from the off-axis angle α by not more than ±1 degree such that at least a first sidewall 151 of two opposite longitudinal sidewalls 151, 152 is parallel to a main crystal plane with high charge carrier mobility, e.g., a {11-20} crystal plane. The second sidewall 152 may be tilted to the main crystal plane by twice the off-axis angle α, e.g., by 4 degree or more, for example, by about 8 degrees. The gate structure 150 has a longitudinal extension along a horizontal second direction 192 orthogonal to the cross-sectional plane.

The source region 110 may include a first source portion, which includes the channel portion 112 and the contact portion 111, and a second source portion 118 formed along the second sidewall 152 of the gate structure 150. The first source portion and the second source portion 118 may be electrically connected through the first load electrode 310. Alternatively or in addition, first and second source portions formed between two neighboring gate structures 150 may be connected through third source portions extending in the silicon carbide body 100 from the contact portion 111 to the second source portion 118. The drift structure 130 may include a current spread region 137 that directly adjoins the body region 120 and that may extend between neighboring shielding regions 160.

The auxiliary region 170 includes a plurality of auxiliary portions 171 and the channel portion 112 includes a plurality of channel segments 1121. The channel segments 1121 and the auxiliary portions 171 alternate along a horizontal first direction 191, which is orthogonal to the second direction 192. The channel segments 1121 may form a vertical JFET integrated in the source region 110 of the transistor cell TC.

Figure 4A:
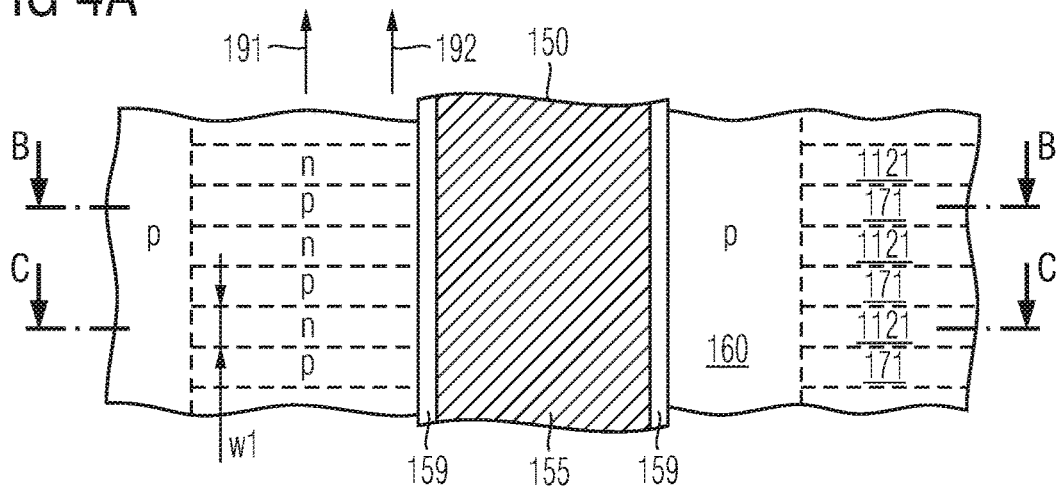
Figure 4B:
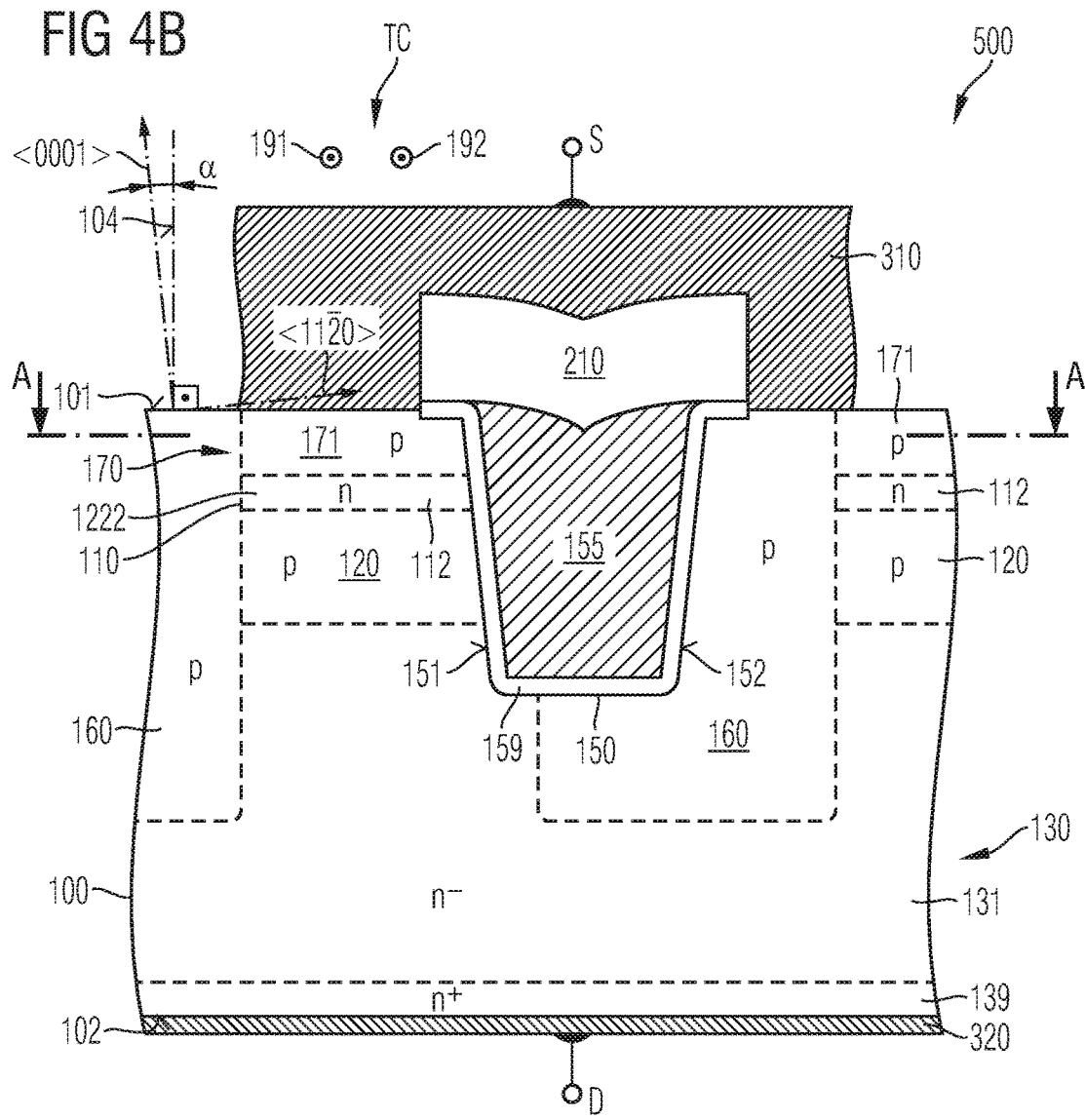

In FIGS. 4A-4C the channel segments 1121 and the auxiliary portions 171 alternate along a horizontal first direction 191, which is parallel to the second direction 192. A channel main portion 1122 between the auxiliary portions 171 and the body region 120 may connect the channel segments 1121. The channel segments 1121 may form a vertical JFET integrated in the source region 110 of the transistor cell TC.

Figure 5A:
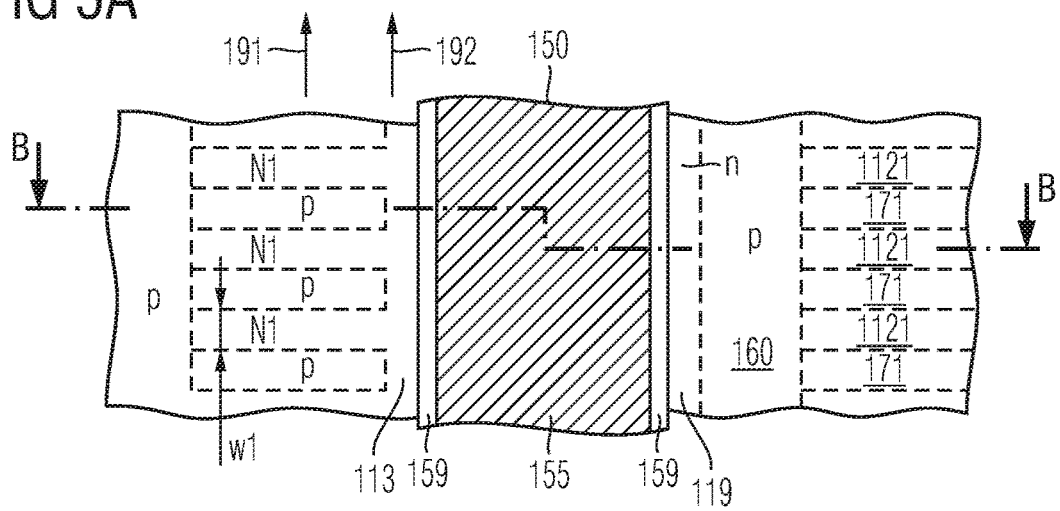
FIGS. 5A-5B show schematic horizontal and vertical cross-sectional views of a portion of a SiC device according to an embodiment with an auxiliary control structure formed at a distance to a gate structure.
Figure 5B:
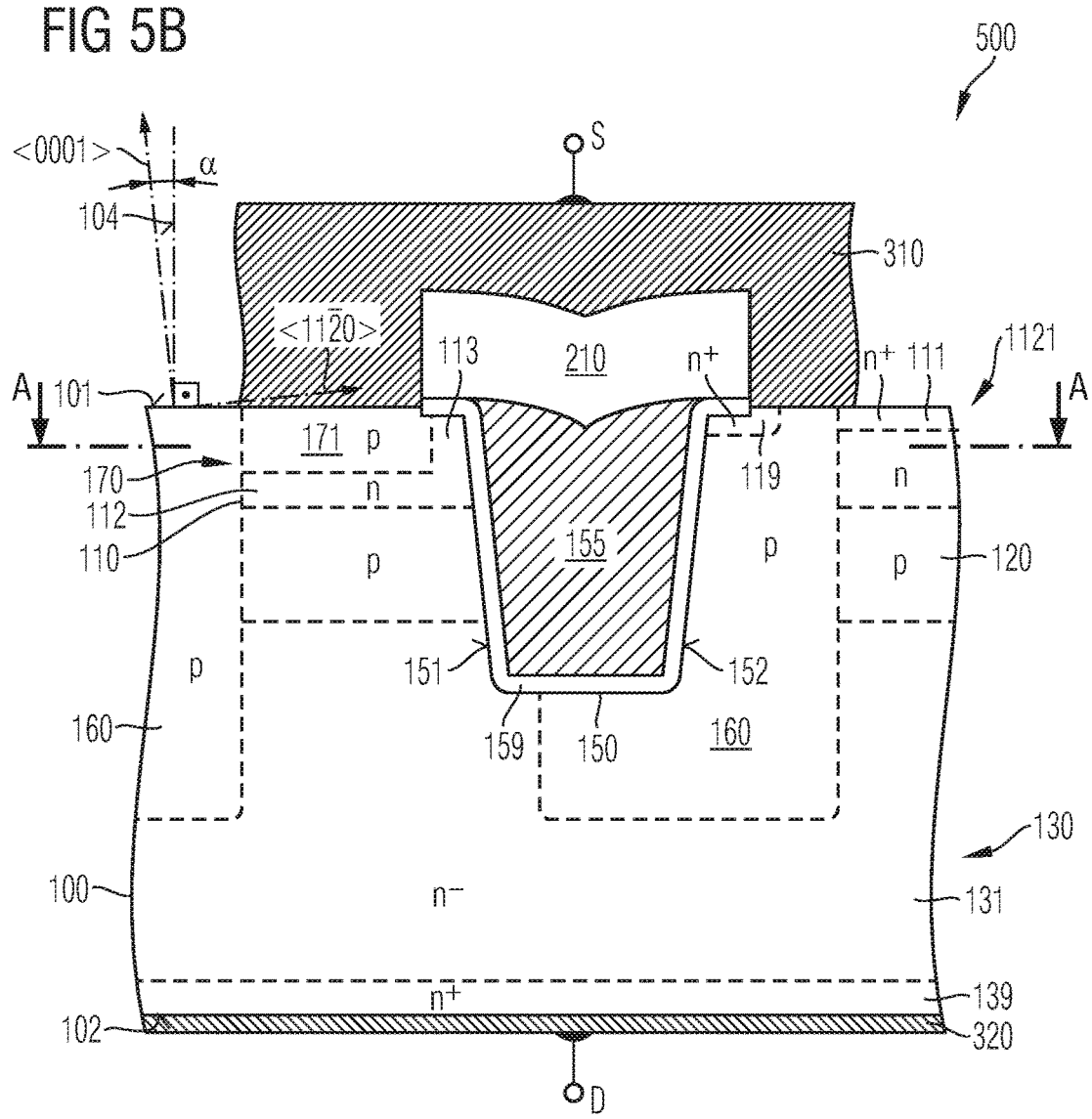

FIGS. 5A-5B the source region 110 includes a third portion 113 between the auxiliary portions 171 and the gate structure 150. For example, the third portion 113 may separate auxiliary portions 171 from the gate structure 150. The channel segments 1121 and the auxiliary portions 171 may alternate along a direction parallel to a longitudinal extension of the gate structure 150.

Figure 6A:
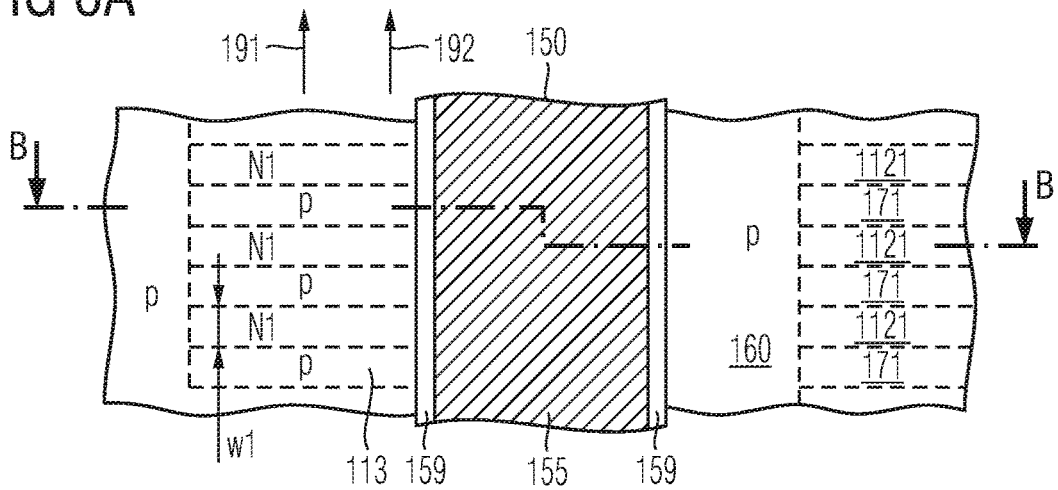
FIGS. 6A-6B show schematic horizontal and vertical cross-sectional views of a portion of a SiC device according to an embodiment with auxiliary regions in contact with a gate structure.
Figure 6B:
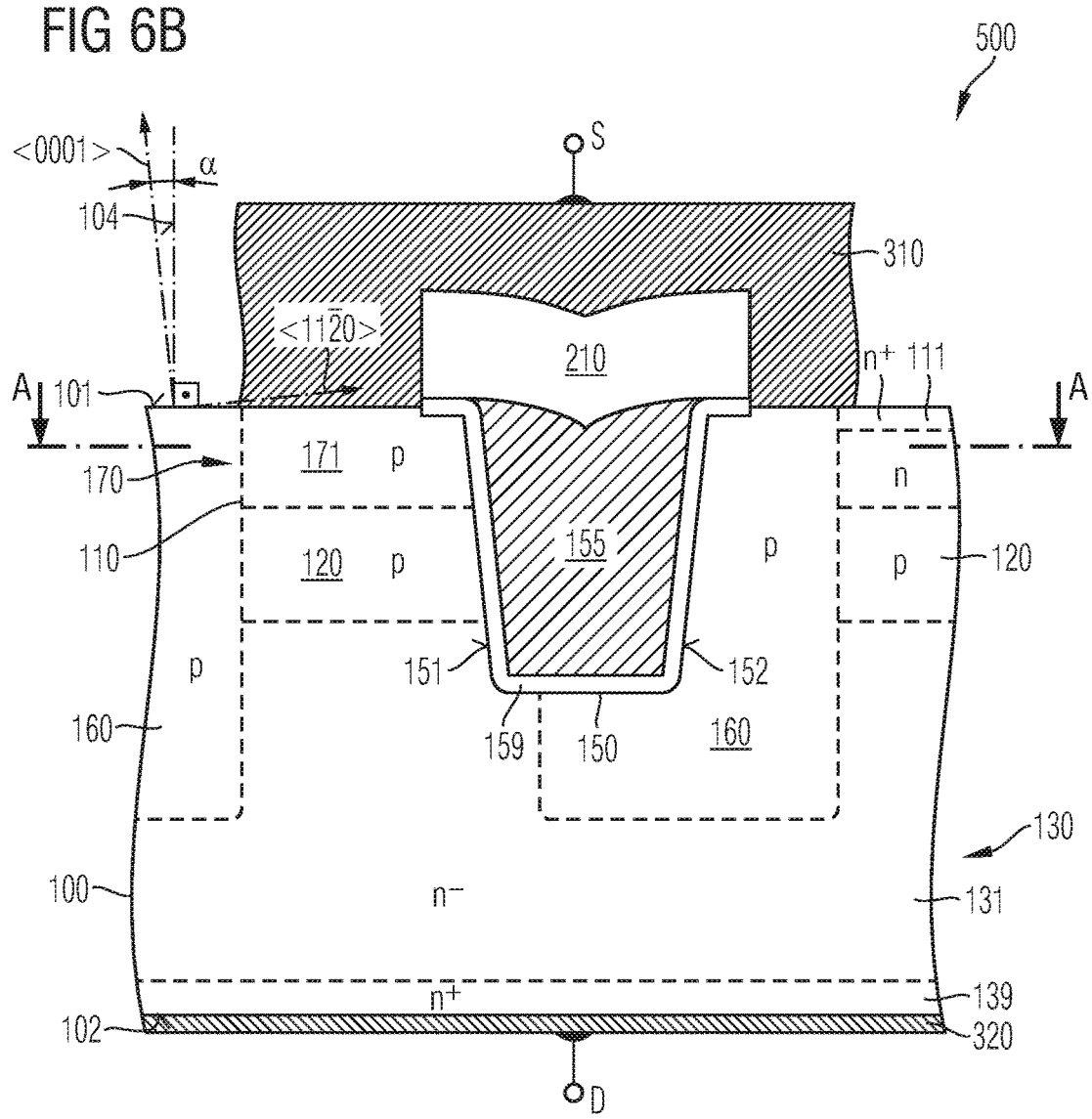

According to FIGS. 6A-6B, the auxiliary portions 171 may extend down to or into the body region 120. Alternatively or in addition, the auxiliary portions 171 may be in contact with the gate structure 150. The channel segments 1121 may form a lateral JFET integrated in the source region 110 of the transistor cell TC.

Figure 7:
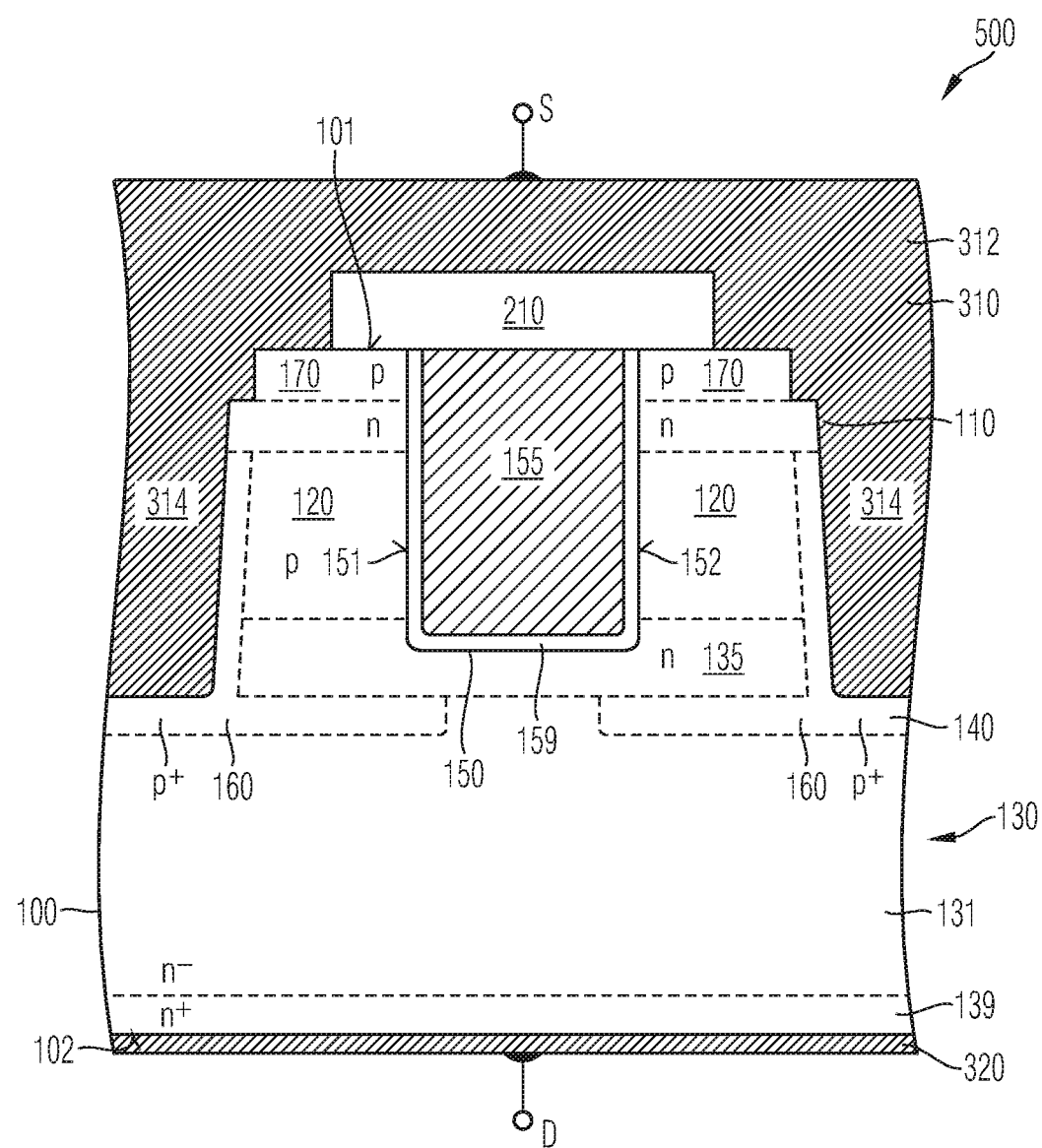
FIG. 7 shows a schematic vertical cross-sectional view of a portion of a SiC device according to an embodiment with contact trenches.

The SiC device 500 illustrated in FIG. 7 includes a gate structure 150 extending from a first surface 101 into a silicon carbide body 100, wherein sidewalls 151, 152 of the gate structure 150 may be vertical to the first surface 101 and parallel to main crystal planes of the silicon carbide body 100.

A first load electrode 310 includes a trench contact 314 that may extend between neighboring gate structures 150 through an opening in an interlayer dielectric 210 into the silicon carbide body 100. Shielding regions 160 with the conductivity type of the body regions 120 may be formed along a bottom and/or along sidewalls of the trench contact 314 and may have a higher dopant concentration than the body regions 120. The shielding regions 160 may be laterally spaced from the gate structures 150.

An auxiliary structure 200 as described with reference to FIGS. 1A to 5B, for example, an auxiliary region 170 as described with reference to FIGS. 2 to 5B may be formed between the first surface 101 and the source region 110. The auxiliary structure 200 may extend from the trench contact 314 to the gate structure 150.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A silicon carbide semiconductor device, comprising:
   a first load electrode;
   a normally-on junction field effect transistor comprising a channel region electrically connected to the first load electrode; and
   an insulated gate field effect transistor electrically connected in series with the normally-on junction field effect transistor, the insulated gate field effect transistor comprising a source region and a body region, the source region being electrically connected to the channel region of the normally-on junction field effect transistor, the body region being electrically connected to the first load electrode.

2. The silicon carbide semiconductor device of claim 1, wherein the normally-on junction field effect transistor comprises a gate region which forms a pn junction with the channel region, and wherein the gate region is electrically connected to the first load electrode.

3. The silicon carbide semiconductor device of claim 1, further comprising a source terminal electrically connected to the first load electrode.

4. The silicon carbide semiconductor device of claim 1, wherein the normally-on junction field effect transistor is configured to be controlled by a voltage drop across the channel region of the normally-on junction field effect transistor, and wherein the voltage drop is caused by a current flow between the first load electrode and the insulated gate field effect transistor.

5. The silicon carbide semiconductor device of claim 1, wherein the insulated gate field effect transistor comprises a trench gate structure.

6. The silicon carbide semiconductor device of claim 1, further comprising a plurality of transistor cells, wherein each transistor cell of the plurality of transistor cells comprises an insulated gate field effect transistor cell and a junction field effect transistor cell embedded in the insulated gate field effect transistor cell.

7. A semiconductor device, comprising:
   a gate structure extending from a first surface of a silicon carbide body into the silicon carbide body;
   a source region extending from the first surface into the silicon carbide body;
   a body region disposed below the source region and having an opposite conductivity type as that source region; and
   an auxiliary control structure extending from the first surface into the source region,
   wherein a vertical extension of the auxiliary control structure is smaller than a vertical extension of the source region, and
   wherein the gate structure is configured to form an inversion channel in the body region.

8. The semiconductor device of claim 7, further comprising:
   a first load electrode,
   wherein the source region comprises a contact portion and a channel portion, wherein the contact portion is in contact with the first load electrode, wherein the channel portion is in contact with the contact portion and with the gate structure, and wherein a mean dopant concentration in the channel portion is at most 10% of a maximum dopant concentration in the contact portion.

9. The semiconductor device of claim 7, wherein the auxiliary control structure comprises an auxiliary region, and wherein the auxiliary region and the source region form a pn junction.

10. The semiconductor device of claim 9, wherein the auxiliary region comprises a plurality of auxiliary portions, wherein the channel portion comprises a plurality of channel segments, and wherein the channel segments and the auxiliary portions alternate along a horizontal first direction.

11. The semiconductor device of claim 10, wherein the gate structure has a longitudinal extension along a horizontal second direction orthogonal to the horizontal first direction.

12. The semiconductor device of claim 10, wherein the gate structure has a longitudinal extension along a horizontal second direction parallel to the horizontal first direction.

13. The semiconductor device of claim 7, wherein the source region comprises a portion between the auxiliary control structure and the gate structure.

14. A semiconductor device, comprising:
a first load electrode;
a gate structure extending from a first surface of a silicon carbide body into the silicon carbide body;
a source region extending from the first surface into the silicon carbide body;
a body region disposed below the source region and having an opposite conductivity type as that source region; and
an auxiliary control structure extending from the first surface into the source region, wherein the source region comprises a contact portion and a channel portion, wherein the contact portion is in contact with the first load electrode, wherein the channel portion is in contact with the gate structure, wherein the contact portion and the channel portion form a unipolar junction, and wherein the gate structure is configured to form an inversion channel in the body region.

15. The semiconductor device of claim 14, wherein the auxiliary control structure comprises an auxiliary region, and wherein the auxiliary region and the source region form a pn junction.

16. The semiconductor device of claim 14, wherein a vertical extension of the auxiliary control structure is smaller than a vertical extension of the source region.

17. The semiconductor device of claim 14, wherein a mean dopant concentration in the channel portion is at most 10% of a maximum dopant concentration in the contact portion.

18. The semiconductor device of claim 1, wherein the channel region of the normally-on junction field effect transistor has the same conductivity type as the source region of the insulated gate field effect transistor.

19. The semiconductor device of claim 7, further comprising a drift zone disposed below the body region and having an opposite conductivity type as the body region, wherein the source region is completely separated from the drift zone by the body region.

20. The semiconductor device of claim 14, further comprising a drift zone disposed below the body region and having an opposite conductivity type as the body region, wherein the source region is completely separated from the drift zone by the body region.

* * * * *